United States Patent
Tsukude et al.

[11] Patent Number: 6,004,834
[45] Date of Patent: Dec. 21, 1999

[54] METHOD OF MANUFACTURING SEMICONDUCTOR DEVICE HAVING A FUSE

[75] Inventors: Masaki Tsukude; Kazutami Arimoto, both of Hyogo, Japan

[73] Assignee: Mitsubishi Denki Kabushiki Kaisha, Tokyo, Japan

[21] Appl. No.: 09/177,483

[22] Filed: Oct. 23, 1998

Related U.S. Application Data

[62] Division of application No. 08/650,695, May 20, 1996, Pat. No. 5,844,295.

[30] Foreign Application Priority Data

Nov. 29, 1995 [JP] Japan ..................... 7-333903

[51] Int. Cl.$^6$ .................................. H01L 21/82
[52] U.S. Cl. ........................... 438/132; 438/601
[58] Field of Search ............... 438/132, 130, 438/467, 601

[56] References Cited

U.S. PATENT DOCUMENTS

| | | |
|---|---|---|
| 4,602,420 | 7/1986 | Saito . |
| 4,628,590 | 12/1986 | Udo et al. . |
| 4,853,758 | 8/1989 | Fischer . |
| 5,025,300 | 6/1991 | Billig et al. . |
| 5,241,212 | 8/1993 | Motonami et al. . |
| 5,578,861 | 11/1996 | Kinoshita et al. . |

FOREIGN PATENT DOCUMENTS

| | | |
|---|---|---|
| 0 189 598 A1 | 8/1986 | European Pat. Off. . |
| 0 531 128 A1 | 3/1993 | European Pat. Off. . |
| 63-92040 | 4/1988 | Japan . |
| 64-71147 | 3/1989 | Japan . |
| 2-215149 | 8/1990 | Japan . |
| 3-83361 | 4/1991 | Japan . |

OTHER PUBLICATIONS

S. Wolf et al., "Silicon Processing for the VLSI Era", Lattice Press, Sunset Beach, California, vol. 1, Process Technology, 1986, pp. 192 and 199.

*Primary Examiner*—Jey Tsai
*Attorney, Agent, or Firm*—McDermott, Will & Emery

[57] ABSTRACT

An interlayer insulating layer is formed to cover a fuse layer. A concave portion is provided on the surface of interlayer insulating layer located directly above fuse layer. A nitride layer as a passivation layer extends on the sidewalls of concave portion. In this way, a semiconductor device is obtained, the device having an improved moisture resistance, and in which a fuse can be easily blown by laser and a design rule of the region adjacent to the fuse can be improved.

4 Claims, 8 Drawing Sheets

FIG. 1

FUSE PORTION  BONDING PAD PORTION

FIG. 2

FUSE PORTION  BONDING PAD PORTION

FIG. 3

FUSE PORTION    BONDING PAD PORTION

FIG. 4

FUSE PORTION    BONDING PAD PORTION

FUSE PORTION      BONDING PAD PORTION

FIG. 8

FUSE PORTION      BONDING PAD PORTION

FIG. 9

FUSE PORTION | BONDING PAD PORTION

FIG. 10

FUSE PORTION | BONDING PAD PORTION

FUSE PORTION     BONDING PAD PORTION

FIG. 15 PRIOR ART

FUSE PORTION     BONDING PAD PORTION

METHOD OF MANUFACTURING SEMICONDUCTOR DEVICE HAVING A FUSE

This application is a divisional of application Ser. No. 08/650,695 filed May 20, 1996, U.S. Pat. No. 5,844,295.

BACKGROUND OF THE INVENTION

1. Field of the Invention

The present invention relates to a semiconductor device and a manufacturing method thereof, and particularly to a semiconductor device with a fuse connected to a redundant circuit and manufacturing method thereof.

2. Description of the Background Art

Redundant circuit provided for repairing a semiconductor device with some defect has been known conventionally. Fuse is generally formed with the redundant circuit, then a defective circuit is replaced with a redundant circuit by appropriately blowing the fuse.

Figure 13:
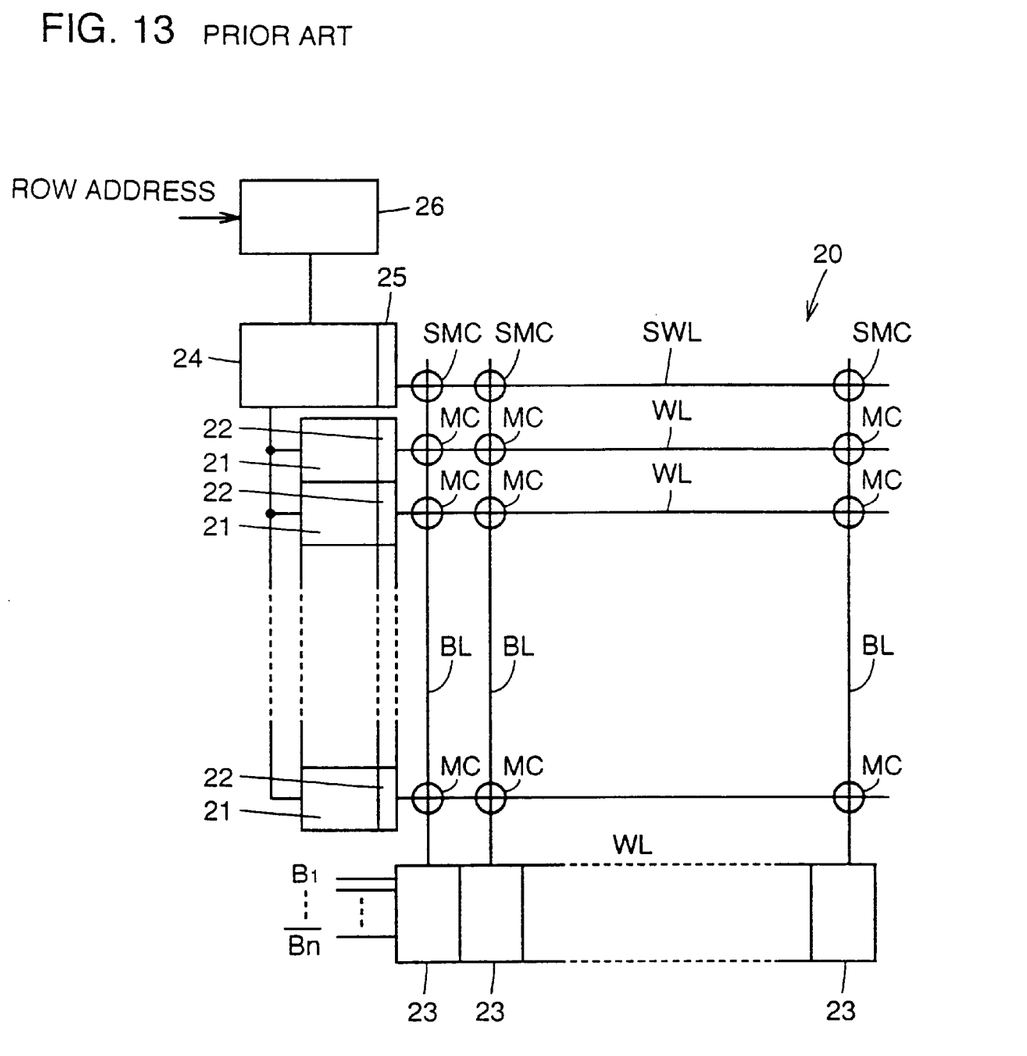
FIG. 13 is a block diagram illustrating the general structure of a DRAM including conventional redundant circuit.

A general structure of one example of a DRAM (Dynamic Random Access Memory) provided with a redundant circuit is shown in FIG. 13. Referring to FIG. 13, in a memory cell array 20, a plurality of word lines WL are extended from respective row decoders 21 through word drivers 22 in a row direction. A plurality of bit lines BL are also extended from respective column decoders 23 in a column direction. These word lines WL and bit lines BL are disposed such that they cross each other. Memory cells MC are provided at the crossings.

At the outside of word lines WL mentioned above, a spare word line SWL is extended from a spare decoder 24 through a spare word driver 25 in the row direction. At the crossings of the spare word line SWL and each of the bit lines BL, spare memory cells SMC are provided.

These spare word line SWL, spare decoder 24, and spare word driver 25 form a so called redundant circuit. A defective address comparison circuit 26 is connected to spare decoder 24, and fuses are formed in defective address comparison circuit 26. As shown in FIG. 13, row address is input to defective address comparison circuit 26.

Figure 14:
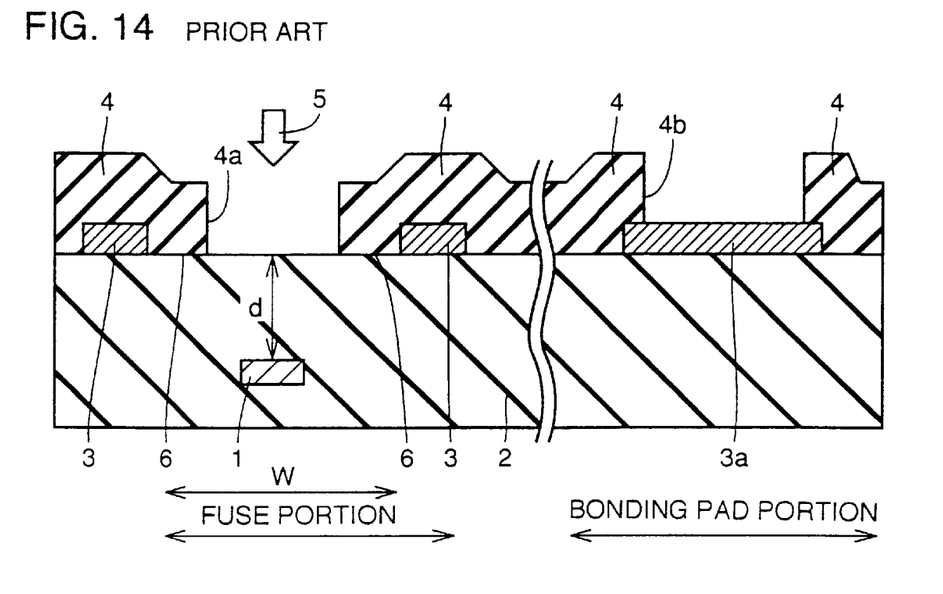
FIG. 14 is a cross section of a conventional semiconductor device.

FIG. 14 shows a fuse portion and its adjacent region as well as a bonding pad portion and its adjacent region in DRAM having above described structure. With reference to FIG. 14, a fuse layer 1 is formed in an interlayer insulating layer 2 provided on a substrate (not shown). Metal interconnection layers 3, 3 and a bonding pad layer 3a are formed on the surface of interlayer insulating layer 2. Bonding pad layer 3a functions as an external connection electrode in order to electrically connect some external device with circuit elements formed on the substrate. A nitride layer functioning as a passivation layer is provided to cover metal interconnection layers 3 and bonding pad layer 3a. Nitride layer 4 has an opening 4a placed directly above fuse layer 1, and has an opening 4b placed directly on boding pad layer 3a.

Next, the way of blowing fuse layer 1 and the timing of performing the step will be described. Conventionally, a test for repairing a semiconductor device (chip) was conducted in the line before completing a wafer process. The chip was repaired by blowing the fuse layer 1 corresponding to a defective part by laser (Laser Trimming: LT). After that, a passivation layer was formed and a wafer process was completed. Next, a rough test (Water Test: WT) of the wafer was performed, roughly screening the number of chips to be tested. Then a formal test (Final Test: FT) was performed to prepare for delivery.

However, nowadays the LT step and WT step are performed simultaneously to shorten the test period. In this case, the passivation layer on fuse layer 1 is selectively removed, and a test is executed for repairing the chip out of the line. That is, the test for repair is carried out on such a device as shown in FIG. 14. Next, fuse layer 1 corresponding to a defective portion is blown off by laser.

In FIG. 14, laser is directed following the arrow 5, blowing off prescribed fuse layer 1. When fuse is blown by laser, the dimension of the thickness d of interlayer insulating layer 2 located on fuse layer 1 becomes an important factor. That is, blowing fuse by laser will be difficult if the thickness d is large. To ease the difficulty, width W of the fuse and its peripheral area should be increased, which is disadvantageous for higher integration of the device.

Figure 15:
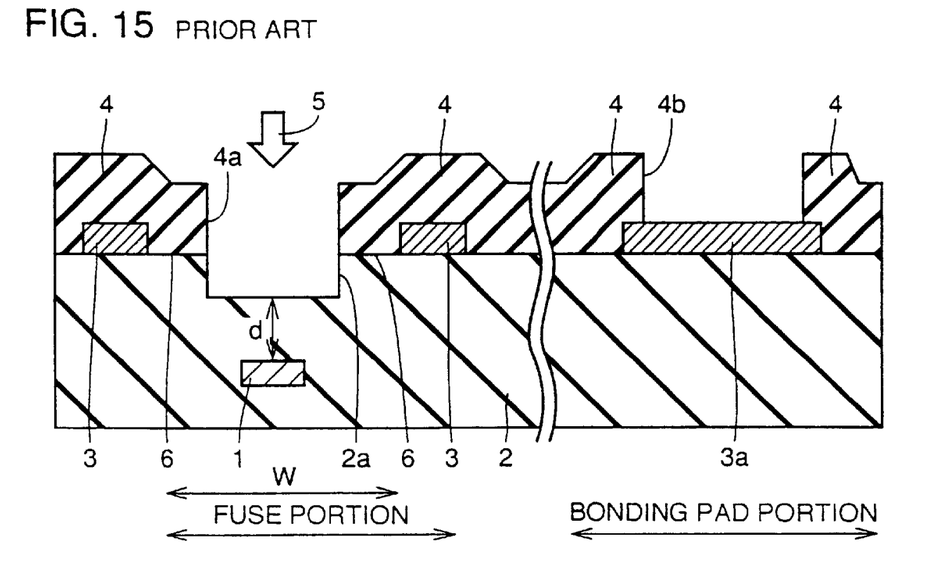
FIG. 15 is a cross section of a modified semiconductor device shown in FIG. 14.

To avoid the above problem, a method as shown in FIG. 15 has been proposed. That is, the thickness d of interlayer insulating layer 2 located on fuse layer 1 is reduced by providing a concave portion 2a on the surface of interlayer insulating layer 2 positioned directly on fuse layer 1. Fuse is then easily blown off by laser. After thus blowing the fuse, a further rough test is given for carrying out a rough screening before the FT step described above.

A following problem still exist in the improved embodiment shown in FIG. 15. An interface 6 between nitride layer 4 and interlayer insulating layer 2 is exposed due to the selective removal of nitride layer 4 located directly above fuse layer 1 as illustrated in FIG. 15. Further, metal interconnection layer 3 formed of material including Al, for example, is provided on the region extending from interface 6. Therefore, water could enter interface 6, possibly causing corrosion of metal interconnection layer 3. As a result, device reliability may be degraded. This is also true in the device shown in FIG. 14.

Above problem associated with the moisture resistance is also experienced at the area adjacent to boding pad layer 3a when passivation layer is provided as a stacked structure of oxide layer and nitride layer. More specifically, if passivation layer is formed as a double layer structure of nitride layer on oxide layer, an interface between oxide layer and nitride layer could be exposed on boding pad layer 3a. In this case, the possibility of water entering the interface between oxide layer and nitride layer becomes higher, lowering the device reliability.

SUMMARY OF THE INVENTION

The invention is made to solve the problem stated above concerning moisture resistance. An object of the invention is to provide a semiconductor device and a manufacturing method thereof in which moisture resistance is improved to enhance the reliability of the device.

Another object of the invention is to provide a semiconductor device and a manufacturing method thereof in which the device reliability can be enhanced, laser blowing can be easily performed, higher integration of circuit elements becomes possible, and a design rule of the area adjacent to a fuse can be improved.

A semiconductor device according to one aspect of this invention includes a redundant circuit, a fuse layer connected to the redundant circuit, an interlayer insulating layer, and a passivation layer. The interlayer insulating layer is formed to cover the fuse layer, and a concave portion having a first opening width larger than the two-dimensional width of the fuse layer is provided on the surface located directly above the fuse layer. The passivation layer is formed to cover the interlayer insulating layer, a first opening having a second opening width smaller than that of the first opening is provided, the first opening exposing the bottom surface of the concave portion is located directly above the fuse layer.

The passivation layer is provided with the first opening having an opening width smaller than that of the concave portion formed on the interlayer insulating layer as described above. Accordingly, the passivation layer can be formed to extend on sidewalls of the concave portion, covering the interface between the passivation layer and the surface of the interlayer insulating layer located around the concave portion. Thus, moisture resistance could be improved. Laser blowing of the fuse layer would be easier as the concave portion is provided. Further, no expansion of the width of the area around the fuse layer is necessary, since moisture resistance could be improved as explained above. That leads to higher integration of circuit elements and improvement of the design rule of the area adjacent to the fuse layer.

A semiconductor device according to another aspect of the invention is provided with a redundant circuit, a fuse layer connected to the redundant circuit, an interlayer insulating layer, and a passivation layer. The interlayer insulating layer is formed to cover the fuse layer, and a concave portion with an opening width larger than the two-dimensional width of the fuse layer is formed. The passivation layer covers the interlayer insulating layer, extending on sidewalls of the concave portion to reach the edge of the bottom surface of the concave portion, exposing the bottom surface of the concave portion located directly above the fuse layer.

In the above described another aspect of the invention, the passivation layer extends on sidewalls of the concave portion to reach the edge of the bottom surface of the concave portion. In this case, the improvement of moisture resistance is also possible as one aspect of the invention. Because the passivation layer is formed to cover the sidewalls of the concave portion and reach the edge of the bottom surface of the concave portion, exposure of the interface between the passivation layer and the surface of the interlayer insulating layer around the concave portion is effectively avoided even if the interlayer insulating layer located on the fuse layer is blown off by blowing the fuse layer by laser. Accordingly, reliability could still be obtained after the fuse is blown.

A semiconductor device according to still another aspect of the invention is provided with an interlayer insulating layer formed on a substrate, a bonding pad layer, a first insulating layer, and a second insulating layer. The bonding pad layer is formed on the surface of the interlayer insulating layer. The first insulating layer covers the interlayer insulating layer, has a first opening which exposes the surface of the bonding pad layer, and has a first relative dielectric constant. The second insulating layer covers the first insulating layer and the sidewalls of the first opening, has a second opening which exposes a part of the surface of the bonding pad layer, and has a second relative dielectric constant higher than the first relative dielectric constant. A passivation layer is then formed of the first and the second insulating layers.

As stated above, in the semiconductor device according to the above mentioned still another aspect of the invention, the second insulating layer is formed to cover the sidewalls of the first insulating layer. The second insulating layer is preferably formed of an insulating layer with better moisture resistance such as nitride layer. The moisture resistance of the area adjacent to the bonding pad layer could be improved by selecting such an insulating layer that has the above described feature. In this aspect of the invention, the lower portion of the passivation layer is formed of the first insulating layer with relatively lower relative dielectric constant (e.g. oxide film). Accordingly, wiring capacitance could be reduced as compared with a passivation layer formed only of the second insulating layer of, e.g., nitride layer with relatively higher relative dielectric constant.

In a method of manufacturing a semiconductor device according to one aspect of the invention, a fuse layer connected to a redundant circuit is formed first. Next, an interlayer insulating layer is provided to cover the fuse layer. A concave portion is then formed with a first opening width larger than the two-dimensional width of the fuse layer on the surface of the interlayer insulating layer located directly on the fuse layer. A passivation layer is formed to cover the concave portion and the interlayer insulating layer. On this passivation layer, a mask layer is deposited with a first opening having a second opening width smaller than the first opening width provided directly above the fuse layer. The passivation layer is etched using this mask layer, then a second opening is provided exposing the bottom surface of the concave portion located directly above the fuse layer.

In this way, in the method of manufacturing a semiconductor device according to one aspect of the invention, the passivation layer is etched using the mask layer which has an opening with an opening width smaller than that of the concave portion. Therefore, the bottom surface of the concave portion located directly above the fuse layer can be exposed, leaving a part of the passivation layer to cover the sidewalls of the concave portion. Moisture resistance could thus be enhanced. As stated above, the sidewalls of the concave portion could be protected by the passivation layer when fuse is blown by laser, since a part of the passivation layer can be left to cover the sidewalls of the concave portion. Reliability of a semiconductor device after fuse is blown is thus improved. It is noted that fuse can be blown easily since the concave portion is placed directly above the fuse layer. Therefore, higher integration of circuit elements could be achieved advantageously without increasing the width of the region around fuse layer.

In a method of manufacturing a semiconductor device according to another aspect of the invention, a fuse layer connected to a redundant circuit is formed first. Next, an interlayer insulating layer is provided to cover this fuse layer. A bonding pad layer is formed not to overlap the fuse layer. A first insulating layer, having a first relative dielectric constant and forming a part of a passivation layer is formed to cover the bonding pad layer and the interlayer insulating layer. A first opening and a second opening are provided in the first insulating layer. The first opening penetrates through the first insulating layer located directly above the fuse layer and has a first opening width. The second opening penetrates through the first insulating layer such that the surface of the bonding pad layer is selectively exposed. A concave portion having sidewalls connected to the sidewalls of the first opening and having a bottom surface in the interlayer insulating layer is provided on the surface of the interlayer insulating layer. Next, a second insulating layer having a second relative dielectric constant higher than the first relative dielectric constant and forming a part of the passivation layer is deposited on the first insulating layer to cover the first and the second openings and the concave portion. On the second insulating layer, a mask layer is formed. The mask layer is provided with a third opening with a second opening width smaller than the first opening width directly above the fuse layer, and provided with a fourth opening on the second opening. By etching the second insulating layer using this mask layer, a fifth opening which exposes the bottom surface of the concave portion located directly above the fuse layer, and a sixth opening which selectively exposes the surface of the bonding pad layer are formed.

In this way, in the method of manufacturing a semiconductor device according to another aspect of the invention, the concave portion could be formed on the surface of the interlayer insulating layer using the bonding pad layer as an etching stopper after forming the first and the second openings. By providing this concave portion, fuse could be easily blown by laser. Additionally, the mask layer including the third opening with the second opening width smaller than the first opening width of the concave portion is provided directly above the fuse layer. The second insulating layer is etched utilizing this mask layer. Therefore, a part of the second insulating layer could be left such that it covers the sidewalls of the concave portion, improving moisture resistance of a semiconductor device. Reliability of a semiconductor device after the fuse blowing could be enhanced as in the case according to the above described one aspect of the invention.

In a method of manufacturing a semiconductor device according to still another aspect of the invention, an interlayer insulating layer is provided on a substrate first. A bonding pad layer is formed on the surface of the interlayer insulating layer. A first insulating layer, having a first relative dielectric constant and forming a part of a passivation layer is then provided to cover the bonding pad layer. The first insulating layer is selectively etched, exposing the surface of the bonding pad layer, and forming a first opening with a first opening width in the first insulating layer. A second insulating layer is formed on the first insulating layer to cover the first opening. The second insulating layer has a second relative dielectric constant higher than the first relative dielectric constant and forms a part of the passivation layer. On the second insulating layer, a mask layer provided with a second opening on the first opening is formed, the second opening having a second opening width smaller than the first opening width. By etching the second insulating layer using this mask layer, a third opening which exposes a part of the surface of the bonding pad layer is formed, and the sidewalls of the first opening are covered by the second insulating layer.

As described above, in the method of manufacturing a semiconductor device according to still another aspect of the invention, the second insulating layer is etched using mask layer, the mask layer having the second opening with an opening width smaller than that of the first opening provided in the first insulating layer located on the bonding pad layer. Accordingly, a part of the second insulating layer could be left to cover the sidewalls of the first opening, improving moisture resistance of the region adjacent to the bonding pad layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be set forth referring to FIGS. 1–12.

First Embodiment

Figure 1:
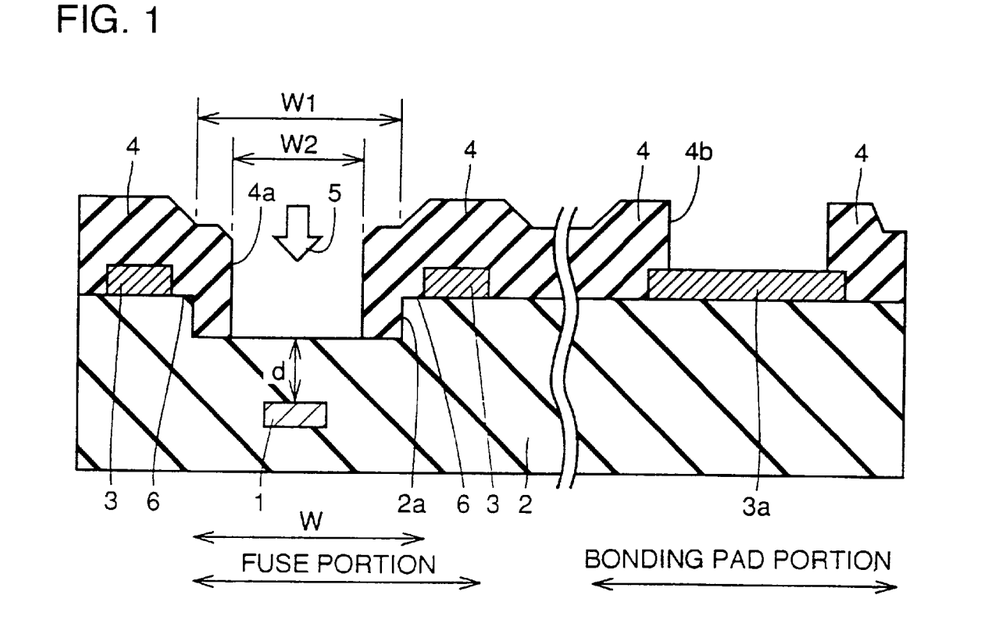
FIG. 1 is a cross section illustrating a semiconductor device according to the first embodiment of the invention.

With reference to FIGS. 1–5, the first embodiment of the invention will be described. FIG. 1 is a cross section illustrating a semiconductor device according to the first embodiment of the invention.

Referring to FIG. 1, a semiconductor device according to this invention is provided with a fuse portion in which a fuse layer 1 is formed, and a bonding pad portion in which a bonding pad layer 3a is formed. In the fuse portion, an interlayer insulating layer 2 formed of silicon oxide or the like is provided to cover fuse layer 1 formed of conductive material. On the surface of interlayer insulating layer 2 located directly on fuse layer 1, a concave portion 2a with an opening width W1 which is larger than the two-dimensional width of fuse layer 1 is formed. The above two-dimensional width is the width of fuse layer 1 seen in the direction of arrow 5 in FIG. 1. By providing concave portion 2a in this way, the thickness d of interlayer insulating layer 2 located on fuse layer could be reduced, and fuse layer 1 could be blown easily by laser.

A metal interconnection layer 3 formed of material including Al, for example, is provided on the surface of interlayer insulating layer 2 located around concave portion 2a. A nitride layer 4 functioning as a passivation layer is formed to cover metal interconnection layer 3. Preferably, this nitride layer 4 is formed to extend on the sidewalls of concave portion 2a as shown in FIG. 1. Then an interface 6 between nitride layer 4 and interlayer insulating layer 2 located around concave portion 2a could be covered by nitride layer 4. Accordingly, water can be effectively prevented from entering this interface 6, leading to effective prevention of corrosion of metal interconnection layer 3. As a result, moisture resistance as well as reliability of the device could be improved. Further, improvement of moisture resistance makes it unnecessary to extend the width W of the area around fuse layer 1, thereby achieving higher integration of circuit elements and improving the design rule of the area around fuse layer.

An opening 4a is provided in nitride layer 4, exposing the bottom surface of concave portion 2a as shown in FIG. 1. Preferably, the opening width W2 of opening 4a is smaller than the opening width W1 of concave portion 2a. At this time, opening 4a is provided directly above fuse layer 1.

On the other hand, in the bonding pad portion, an opening 4b is formed on the region directly above bonding pad layer 3a.

When fuse is to be blown off in the semiconductor device of the structure described above, laser is directed to opening 4a according to the arrow 5 after the deposition of nitride layer 4 functioning as a passivation layer 2. Then fuse layer 1 as well as interlayer insulating layer 2 formed on this fuse layer 1 are blown off. Fuse blowing is carried out in this way.

Figure 2:
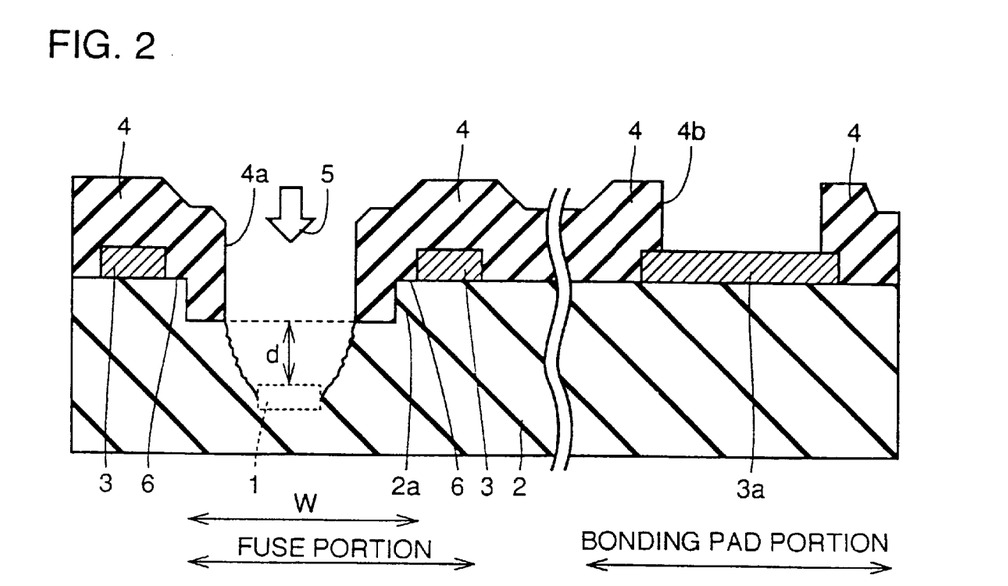
FIG. 2 is a cross section of the semiconductor device shown in FIG. 1 after the fuse is blown by laser.

FIG. 2 shows a cross section of the structure of the semiconductor device after its fuse is blown off. Nitride layer 4 is formed to cover the sidewalls of concave portion 2a, effectively preventing interface 6 from being exposed after fuse is blown off as shown in FIG. 2. Accordingly, reliability of a semiconductor device after the fuse blowing could be enhanced.

Figure 3:
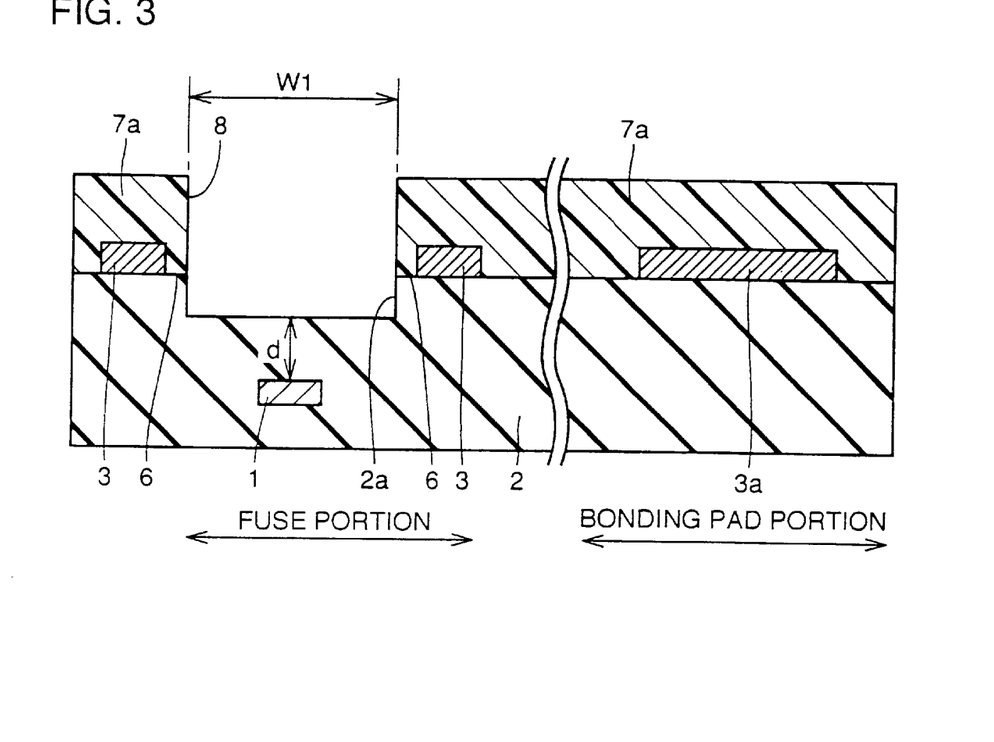
FIGS. 3–5 are cross sections of the semiconductor device shown in FIG. 1 illustrating the characteristic first to third steps of the manufacturing process.
Figure 4:
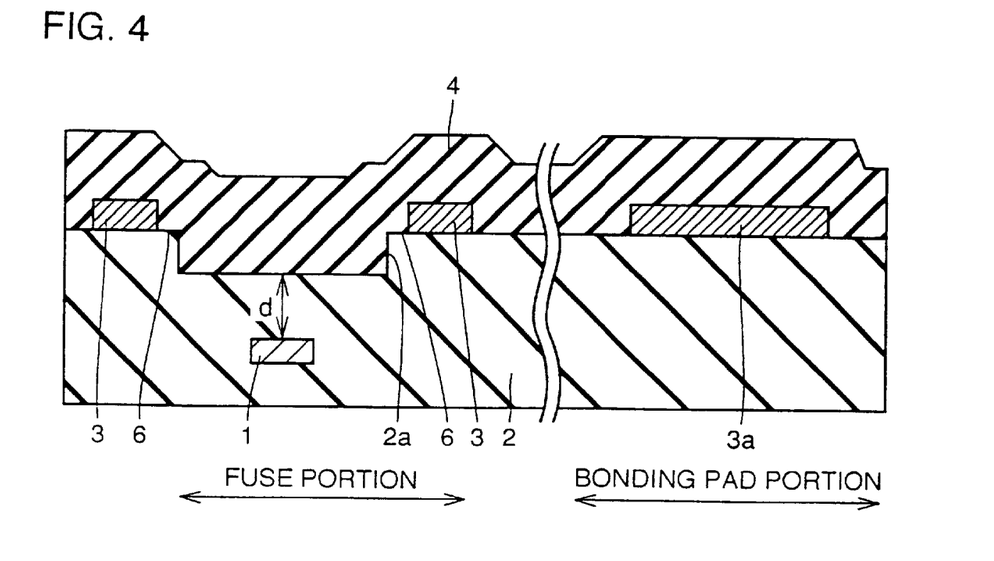
Figure 5:
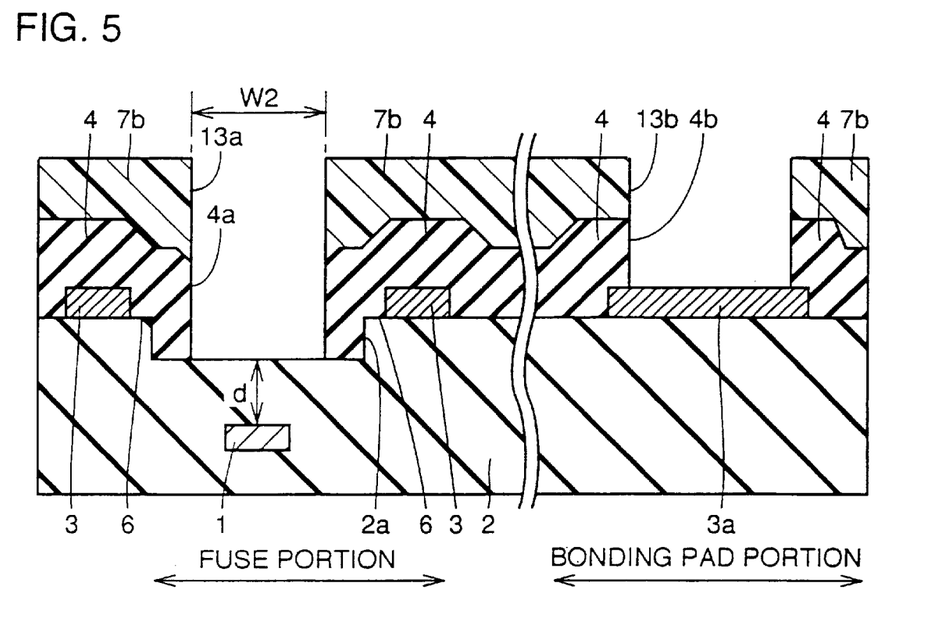

Next with reference to FIGS. 3–5, a manufacturing method of the semiconductor device shown in FIG. 1 will be described. FIGS. 3–5 are cross sections illustrating the characteristic first to third steps of the manufacturing process of the semiconductor device of FIG. 1.

Referring to FIG. 3, fuse layer 1 is formed on a substrate (not shown) with an interlayer insulating layer 2 interposed. Interlayer insulating layer 2 covers various circuit elements formed on the substrate. Interlayer insulating layer 2 is formed to cover fuse layer 1. Metal interconnection layer 3 and bonding pad layer 3a are provided at the prescribed position on the surface of interlayer insulating layer 2. Then a mask layer 7a is formed having an opening 8 which exposes the surface of interlayer insulating layer 2 located immediately on fuse layer 1. This mask layer 7a is formed of resist, for example. The opening width W1 of opening 8 of mask layer 7a is not smaller than the two-dimensional width of fuse layer 1. The surface of interlayer insulating layer 2 is selectively etched using the mask layer 7a. Then concave portion 2a is provided. As a result, the thickness of interlayer insulating layer 2 located on fuse layer 1 is reduced to d.

Next, with reference to FIG. 4, nitride layer 4 is deposited on interlayer insulating layer 2 to cover concave portion 2a, metal interconnection layer 3, and bonding pad layer 3a by CVD (Chemical Vapor Deposition) or the like.

Referring to FIG. 5, a mask layer 7b formed of resist, for example, is deposited on nitride layer 4, then mask layer 7b is patterned using, for example, photolithography process. An opening 13a is thus formed in the region of mask layer 7b located directly above fuse layer 1, and an opening 13b is formed in the region of mask layer 7b located directly above bonding pad layer 3a.

At this point, the opening width W2 of opening 13a is made smaller than the opening width W1 of opening 8 shown in FIG. 3. Nitride layer 4 is etched using mask layer 7b. An opening 4a is then formed directly above fuse layer 1 and an opening 4b is formed directly above bonding pad layer 3a. After that, mask layer 7b is removed. Through the process steps thus shown, the semiconductor device of FIG. 1 is provided.

It is noted that material other than nitride could be utilized as a passivation layer if the material can improve moisture resistance, pressure resistance or the like, although nitride layer 4 is used as a passivation layer in the description of the first embodiment. Also organic material such as polyimide may exist on the nitride layer 4.

Second Embodiment

Next with reference to FIGS. 6–10, a description of the second embodiment of the present invention will be presented.

Figure 6:
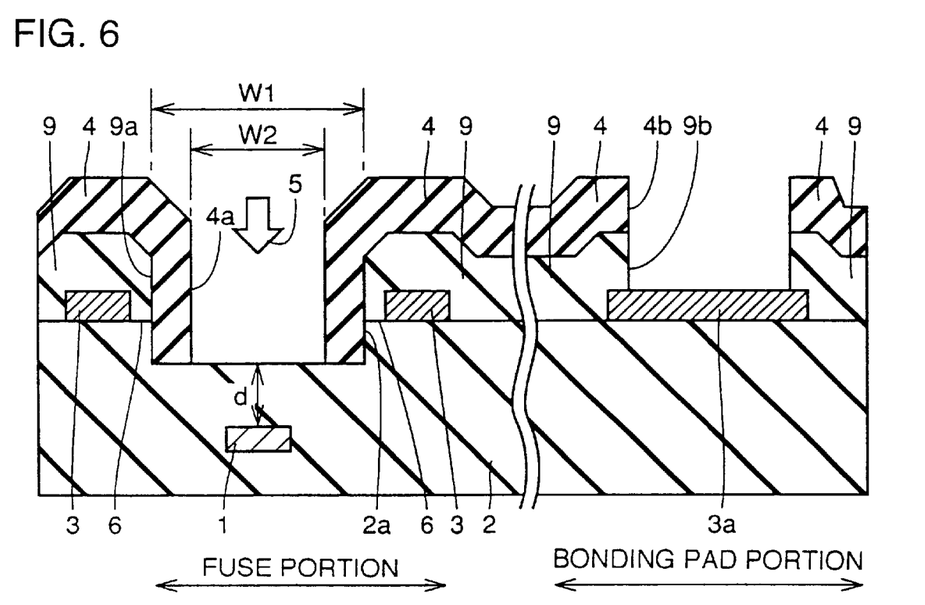
FIG. 6 is a cross section illustrating a semiconductor device according to the second embodiment of the invention.

Referring to FIG. 6, in the second embodiment, a stacked structure of an oxide layer 9 and a nitride layer 4 is utilized as a passivation layer. Other structures of the device are almost similar to those of the first embodiment illustrated above.

An advantage of forming the passivation layer as a stacked structure of oxide layer 9 and nitride layer 4 will be described. Although nitride layer 4 has better moisture resistance than oxide layer 9, it also has high relative dielectric constant. Therefore, wiring capacitance should possibly be increased. Then the passivation layer is provided as a stacked structure of oxide layer 9 and nitride layer 4, making it possible to maintain the moisture resistance and to reduce the wiring capacitance.

When the passivation layer having above mentioned advantage is used, an interface 6 of oxide layer 9 and interlayer insulating layer 2 is exposed by providing concave portion 2a shown in FIG. 15. Water then enters this interface 6, leading to higher possibility of the corrosion of metal interconnection layer 3.

In this case, an opening 9a, having the opening width W1 which is the same as that of concave portion 2a, is formed in oxide layer 9 located directly above fuse layer 1 as shown in FIG. 6. Then nitride layer 4 is formed to extend on the sidewalls of opening 9a and the sidewalls of concave portion 2a. Accordingly, interface 6 could be covered by nitride layer 4, thereby improving moisture resistance. This improvement of moisture resistance makes it unnecessary to expand the width of the region around fuse layer 1, contributing to the higher integration of circuit elements.

On the other hand, an opening 9b is provided in oxide layer 9 located on bonding pad layer 3a.

With reference to FIGS. 7–10 next, a method of manufacturing the semiconductor device of the second embodiment will be described. FIGS. 7–10 are cross sections illustrating the characteristic first to fourth steps of the manufacturing process of the semiconductor device according to the second embodiment.

Figure 7:
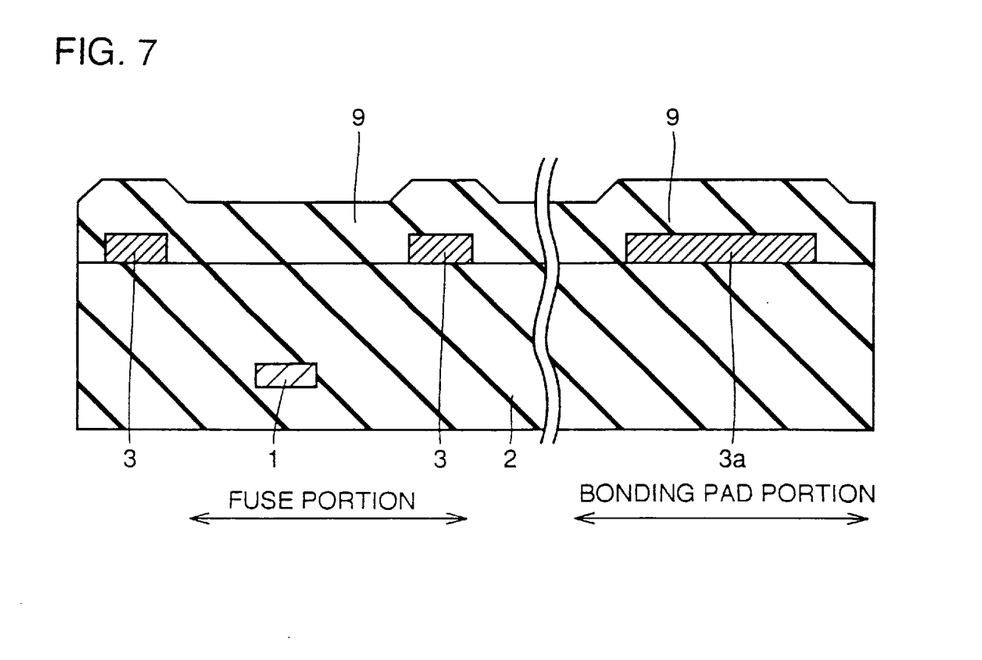
FIGS. 7–10 are cross sections of the semiconductor device shown in FIG. 6 illustrating the characteristic first to fourth steps of the manufacturing process.

Referring to FIG. 7, fuse layer 1, interlayer insulating layer 2, metal interconnection layer 3 and bonding pad layer 3a are provided through the steps similar to those of the first embodiment. Oxide layer 9 is formed on interlayer insulating layer 2 to cover metal interconnection layer 3 and bonding pad layer 3a by CVD or the like.

Figure 8:
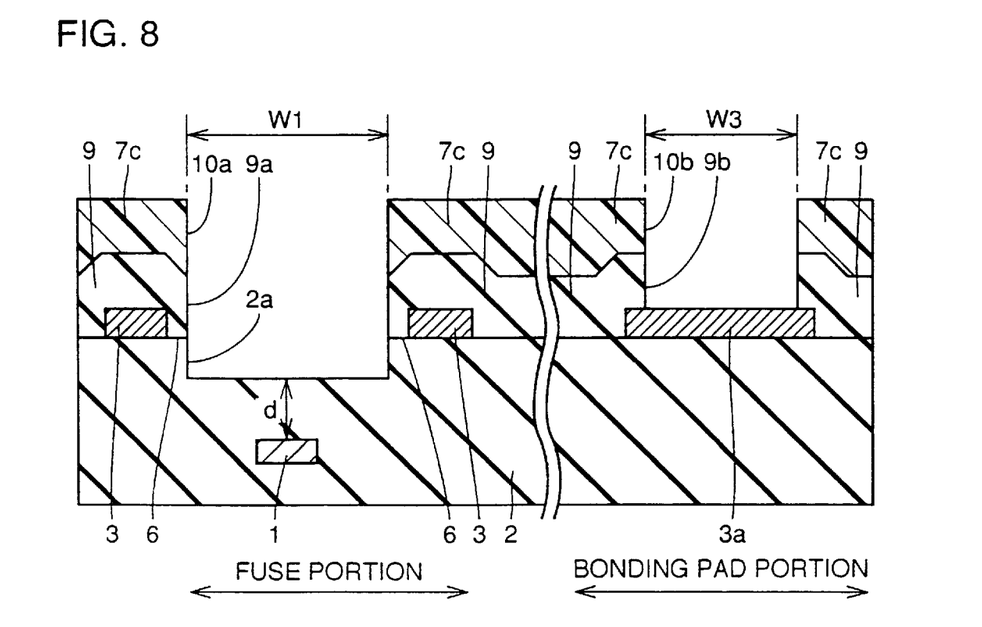

Referring to FIG. 8, a mask layer 7c formed of a resist, for example, is provided on oxide layer 9. Then this mask layer 7c is patterned using, for example, photolithography process. An opening 10a with the opening width W1 is thus provided in the portion of mask layer 7c located directly above fuse layer 1, and an opening 10b with the opening width W3 is provided in the portion of mask layer 7c located immediately above boding pad layer 3a. Using this mask layer 7c as a mask, oxide layer 9 and a part of the surface of interlayer insulating layer 2 are etched. At this time, bonding pad layer 3a functions as an etching stopper in the step of etching interlayer insulating layer 2. By this etching, openings 9a, 9b and concave portion 2a are provided. It is noted that the opening width W1 is larger than the two-dimensional width of fuse layer 1.

Figure 9:
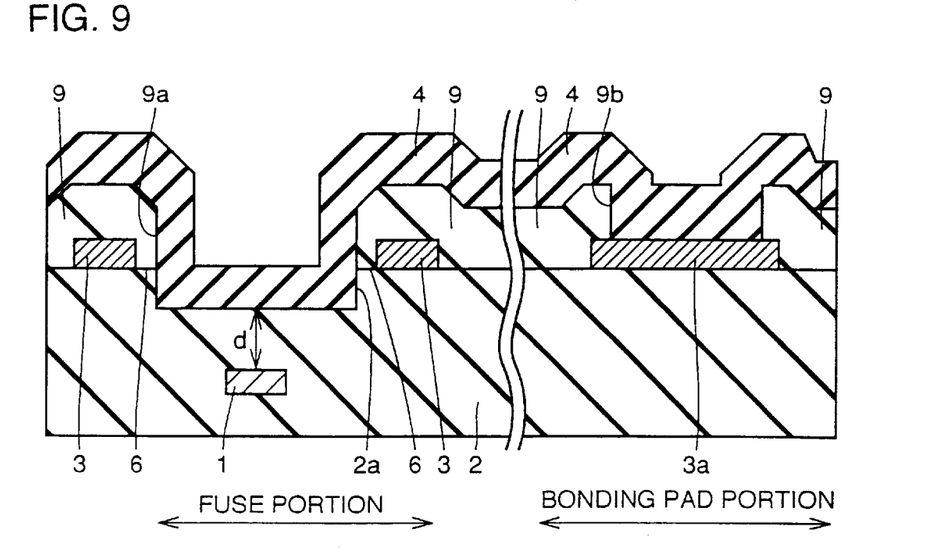
Figure 10:
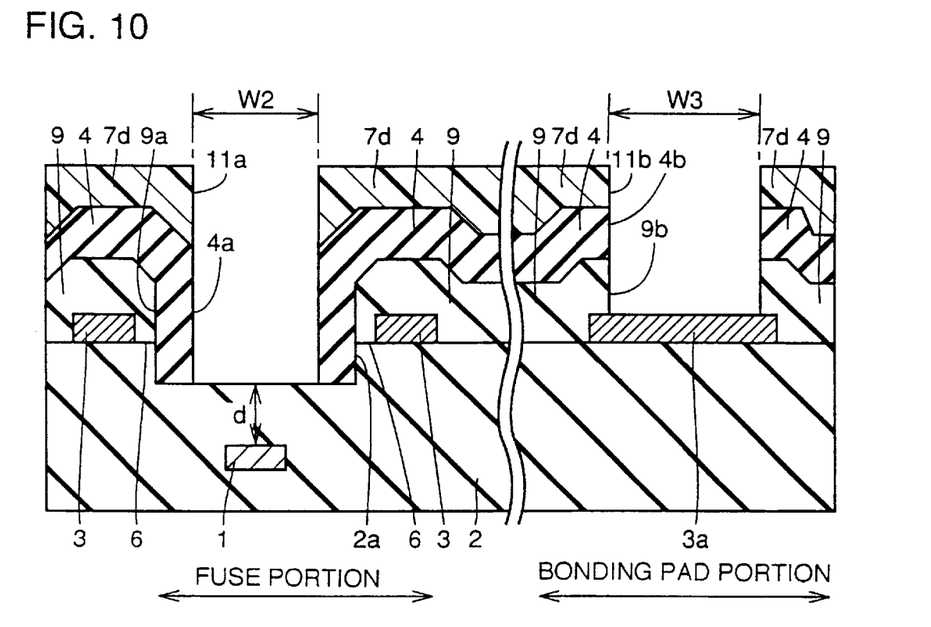

Referring next to FIG. 9, nitride layer 4 is deposited to cover oxide layer 9 by CVD or the like. With reference to FIG. 10, a mask layer 7d formed, for example, of resist is formed on nitride layer 4, and it is patterned to a prescribed shape. Then an opening 11a with the opening width W2 is formed in the region of mask layer 7d located directly above fuse layer 1, and an opening 11b with the opening width W3 is formed in the region of mask layer 7d located directly above bonding pad layer 3a. Nitride layer 4 is etched using this mask layer 7d as a mask, then openings 4a and 4b are formed respectively. It is noted that the opening width W2 of opening 11a in mask layer 7d is made smaller than the opening width W1 in mask layer 7c. Therefore, the opening width of opening 4a is smaller than that of concave portion (2a) and opening 9a. After the formation of openings 4a and 4b, mask layer 7d is removed. The semiconductor device shown in FIG. 6 is thus provided through those process steps described above.

Although the stacked structure of oxide layer 9 and nitride layer 4 is shown as an example in the second embodiment, it is noted that another passivation layer having a stacked structure of the combination of other material may be used, provided that a relative dielectric constant of upper layer is higher than that of lower layer, and the upper layer is formed of material which could improve moisture resistance or dielectric breakdown strength or the like. Organic material such as polyimide may exist on the passivation layer.

Third Embodiment

Figure 11:
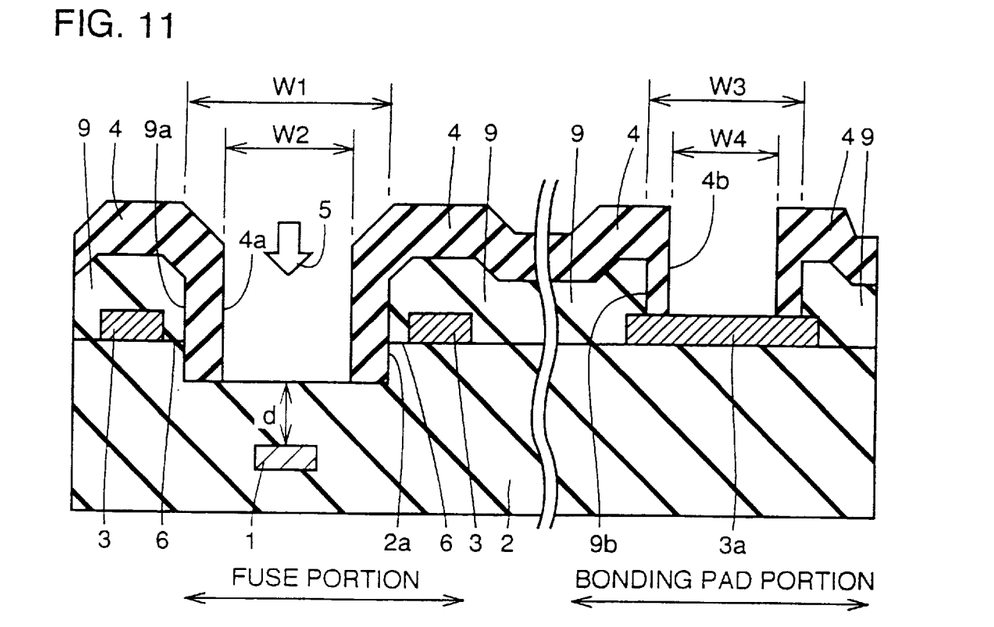
FIG. 11 is a cross section of a semiconductor device according to the third embodiment of the invention.

Next with reference to FIGS. 11 and 12, the third embodiment of the present invention will be described. FIG. 11 is a cross section illustrating a semiconductor device according to the third embodiment.

Referring to FIG. 11, the difference between the semiconductor device of the third embodiment and that of the second embodiment is whether nitride layer 4 extends on the sidewalls of opening 9b provided directly above bonding pad layer 3a or not. As shown in FIG. 11, nitride layer 4 extends on the sidewalls of opening 9b, preventing the interface of oxide layer 9 and bonding pad layer 3a from being exposed. In this way, moisture resistance of the area adjacent to bonding pad layer 3a could be improved.

As shown in FIG. 11, nitride layer 4 extends on the sidewalls of opening 9b, resulting in the smaller opening width W4 of opening 4b located on bonding pad layer 3a than the opening width W3 of opening 9b located on bonding pad layer 3a. Other structures of the device are similar to those of the second embodiment shown in FIG. 6.

Figure 12:
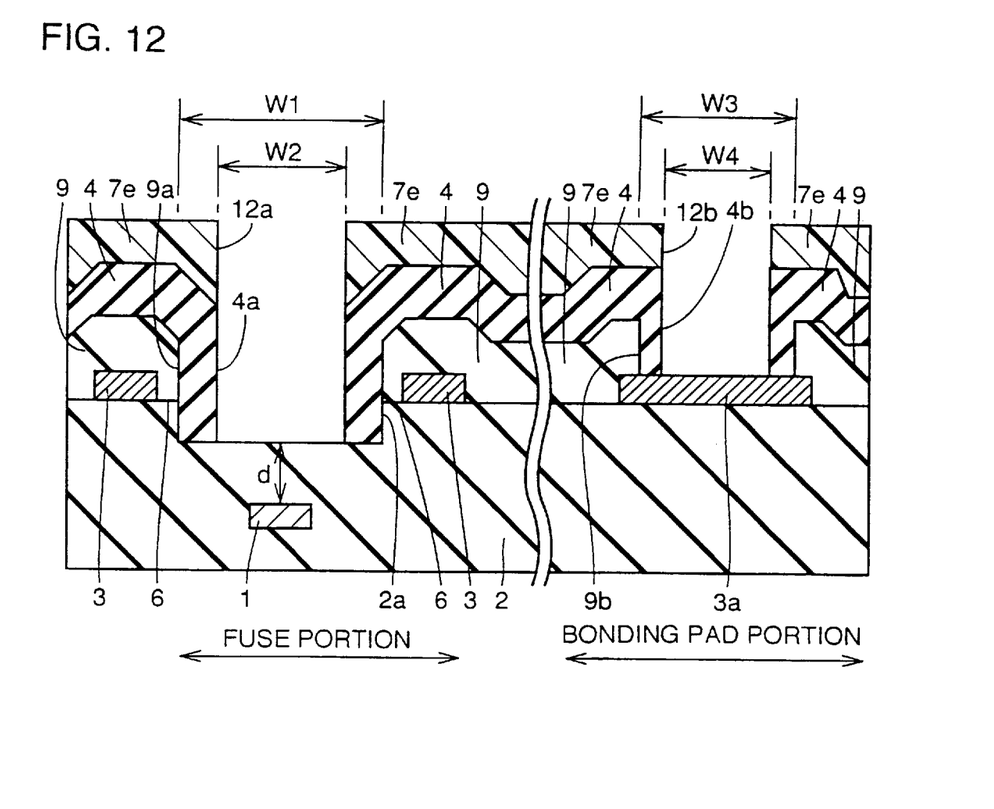
FIG. 12 is a cross section of the semiconductor device shown in FIG. 11 illustrating the characteristic manufacturing process.

Referring to FIG. 12 next, a method of manufacturing the device of the third embodiment will be described. FIG. 12 is a cross section showing a characteristic step of the semiconductor device according to the third embodiment.

Through the process steps similar to those of the second embodiment, the structures are completed up to nitride layer 4. A mask layer 7e formed of resist or the like is provided on nitride layer 4, and mask layer 7e is patterned to a prescribed shape. An opening 12a with the opening width W2 is formed in the area of mask layer 7e located directly above fuse layer 1, and an opening 12b with the opening width W4 is formed in the area of mask layer 7e located directly above bonding pad layer 3a.

It is noted that the opening width W2 is made smaller than W1, and the opening width W4 is made smaller than W3. Using this mask layer 7e as a mask, nitride layer 4 is etched and openings 4a and 4b are formed. After that, mask layer 7e is removed. Through those process steps, the semiconductor device shown in FIG. 11 is provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

forming a fuse layer connected to a redundant circuit;

forming an interlayer insulating layer to cover said fuse layer;

forming a concave portion on a surface of said interlayer insulating layer located directly above said fuse layer, having a first opening width (W1) larger than the two-dimensional width of said fuse layer;

forming a passivation layer to cover said concave portion and said interlayer insulating layer;

forming a mask layer on said passivation layer, provided with a first opening with a second opening width (W2) smaller than said first opening width (W1) directly above said fuse layer; and forming a second opening in said passivation layer, exposing a bottom surface of said concave portion located directly above said fuse layer by etching said passivation layer using said mask layer as a mask.

2. A method of manufacturing a semiconductor device, comprising the steps of:

forming a fuse layer connected to a redundant circuit;

forming an interlayer insulating layer to cover said fuse layer;

forming a bonding pad layer on said interlayer insulating layer not to overlap said fuse layer;

forming a first insulating layer having a first relative dielectric constant and constituting a part of a passivation layer to cover said bonding pad layer and said interlayer insulating layer;

forming, in said first insulating layer, a first opening with a first opening width (W1) penetrating said first insulating layer located directly above said fuse layer, and a second opening penetrating said first insulating layer to selectively expose a surface of said bonding pad layer, and forming a concave portion having sidewalls connected to sidewalls of said first opening and a bottom surface in said interlayer insulating layer on a surface of said interlayer insulating layer;

forming a second insulating layer having a second relative dielectric constant higher than said first relative dielectric constant and constituting a portion of said passivation layer on said first insulating layer to cover said first and second openings and said concave portion;

forming a mask layer on said second insulating layer, provided with a third opening with a second opening width (W2) smaller than said first opening width (W1) directly above said fuse layer, and provided with a fourth opening on said second opening; and forming a fifth opening exposing a bottom surface of said concave portion located directly above said fuse layer, and a sixth opening selectively exposing the surface of said bonding pad layer by etching said second insulating layer using said mask layer as a mask.

3. The method of manufacturing a semiconductor device according to claim 2, wherein the opening width of said fourth opening is adjusted to be smaller than the opening width of said second opening, and the step of forming said mask layer includes the step of forming said mask layer to cover the sidewalls of said second opening.

4. A method of manufacturing a semiconductor device, comprising the steps of:

forming an interlayer insulating layer on a substrate;

forming a bonding pad layer on a surface of said interlayer insulating layer;

forming a first insulating layer with a first relative dielectric constant to cover said bonding pad layer, constituting a portion of a passivation layer;

forming a first opening with a first opening width exposing a surface of said bonding pad layer in said first insulating layer, by selectively etching said first insulating layer;

forming a second insulating layer with a second relative dielectric constant higher than said first relative dielectric constant on said first insulating layer to cover said first opening, constituting a portion of said passivation layer;

forming a mask layer provided with a second opening with a second opening width smaller than said first opening width directly above said first opening; and forming a third opening which exposes a portion of said bonding pad layer by etching said second insulating layer using said mask layer as a mask, and covering sidewalls of said first opening with said second insulating layer.

\* \* \* \* \*